United States Patent [19]

Kouhei et al.

[11] Patent Number: 5,515,314
[45] Date of Patent: May 7, 1996

[54] STORAGE DEVICE

[75] Inventors: Tohru Kouhei; Hideyuki Kikuchi, both of Kawasaki, Japan

[73] Assignee: Fujitsu Limited, Kawasaki, Japan

[21] Appl. No.: 417,259

[22] Filed: Apr. 5, 1995

[30] Foreign Application Priority Data

May 27, 1994 [JP] Japan .................................. 6-115464

[51] Int. Cl.⁶ ................................................. G11C 11/15
[52] U.S. Cl. ............................ 365/158; 365/173; 365/157
[58] Field of Search ..................................... 365/158, 157, 365/171, 173, 8; 360/113

[56] References Cited

U.S. PATENT DOCUMENTS

| | | | |
|---|---|---|---|
| 4,356,523 | 10/1982 | Yeh | 365/158 |
| 4,829,476 | 5/1989 | Dupuis et al. | 365/158 |
| 4,897,288 | 1/1199 | Jenson | 365/158 |
| 5,012,444 | 4/1991 | Hurst, Jr. et al. | 365/158 |
| 5,343,422 | 8/1994 | Kung et al. | 365/158 |

FOREIGN PATENT DOCUMENTS

| | | |
|---|---|---|
| 63-42089 | 2/1988 | Japan . |
| 1-198085 | 8/1989 | Japan . |
| 3-30181 | 2/1991 | Japan . |

*Primary Examiner*—Tan T. Nguyen
*Attorney, Agent, or Firm*—Nikaido, Marmelstein, Murray & Oram

[57] ABSTRACT

A storage device includes an MR element; write circuit responsive to input of binary storage data indicative of either a first state or a second state, and applying a write magnetic field in a first direction correspondingly to the first state, or applying the write magnetic field in a reverse second direction correspondingly to the second state; and read circuit for applying a bias magnetic field to the MR element and discriminating between the first and second states in accordance with the volume resistivity of the MR element.

16 Claims, 13 Drawing Sheets

FIG.15B and

STORAGE DEVICE

BACKGROUND OF THE INVENTION

1. Field of the Invention

The present invention generally relates to a storage device for storing binary data and, more particularly, to a storage device equipped with a magnetoresistive element presenting hysteresis characteristics in the relationship between a magnetic field and a volume resistivity change rate (MR ratio).

2. Description of the Related Art

In the field of computers and communication systems which deal with digital data, storage devices for storing binary data are required. Such a storage device is so constituted as to retain either temporarily or permanently the difference of some physical states such as magnetic ones.

In the conventional storage devices known heretofore, there is a type capable of storing data in accordance with the presence or absence of electric charge accumulated in a capacitor, as represented by a dynamic random access memory (DRAM). However, a DRAM has a disadvantage that the data stored therein is lost unless an overwrite operation termed refresh is performed continuously. That is, there exists a problem of nonvolatility.

Any of magnetic recording apparatus represented by a magnetic disk apparatus is nonvolatile, since data is recorded by changing the direction of magnetization of a magnetic substance. But a rotary mechanism, a read/write head positioning mechanism and so forth are necessary therein, and a long time is taken for positioning the head and transferring the data. Consequently, a considerable time is required for writing and reading the data.

A flash memory is known as a nonvolatile semiconductor storage device. Since an overwrite operation is impossible in a flash memory, it is necessary to perform an erase operation first and then a write operation, hence inducing a disadvantage that this type is not suited for high-speed repetitive recording purpose. And the ensured number of times of writing is no more than $1 \times 10^5$ or so.

In Japanese Patent Laid-open Nos. Hei 1 (1989)-178190, Hei 1 (1989)-178191 and Sho 61 (1986)-153897, there is disclosed a method of recording data on a magnetic medium by causing a current flow in intersecting striped superconductors, and detecting the direction of magnetization by adjacent magnetoresistive elements. However, in this method where superconductors are required, there exist some problems including that it is unemployable at normal temperature, and the production cost of the apparatus is increased. Furthermore, there is another disadvantage that both a recording magnetic medium and reading magnetoresistive elements need to be prepared.

In the thesis titled Magnetic Thin Film (by Miyazaki, Tohoku University), there is described a testing method according to which a thin film is interposed between mutually orthogonal conductors via insulator layers, and the magnetic characteristic of the thin film is measured by a tunnel current detection means. Although this method is capable of realizing a device of a simplified structure, it is difficult to apply the method to a practical recorder since the change range of the resistance value is excessively small due to utilization of the tunnel current. In addition, the magnetic field generation efficiency to the current is low as the magnetic field of the orthogonal lines is utilized directly.

SUMMARY OF THE INVENTION

It is therefore an object of the present invention to provide a high-reliability nonvolatile storage device of a simplified structure which is usable in a normal temperature range and is adequate to reduce the time required for writing, reading or overwriting data.

According to one aspect of this invention, there is provided a storage device which comprises: a magnetoresistive element presenting hysteresis characteristics in the relationship between a magnetic field and a volume resistivity change rate; write means for applying, in response to input binary storage data indicative of either a first state or a second state, a write magnetic field of a predetermined intensity in a first direction to the magnetoresistive element correspondingly to the first state, or applying the write magnetic field in a second direction, which is reverse to the first direction, to the magnetoresistive element correspondingly to the second state; and read means for applying to the magnetoresistive element a bias magnetic field which is lower in intensity than the write magnetic field, and discriminating between the first and second states on the basis of the volume resistivity change rate of the magnetoresistive element.

When binary storage data indicative of either a first state or a second state is inputted to the device of this invention, a write magnetic field is applied to the magnetoresistive element in one of mutually reverse directions correspondingly to the first state or the second state. Then, even after extinction of the write magnetic field, the stored data is retained by the hysteresis characteristics of the magnetoresistive element.

In reading out the stored data, a bias magnetic field lower in intensity than the write magnetic field is applied to the magnetoresistive element, and the first or second state is discriminated in accordance with the volume resistivity change rate of the magnetoresistive element.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

Hereinafter some preferred embodiments of the present invention will be described in detail with reference to the accompanying drawings.

Figure 1:
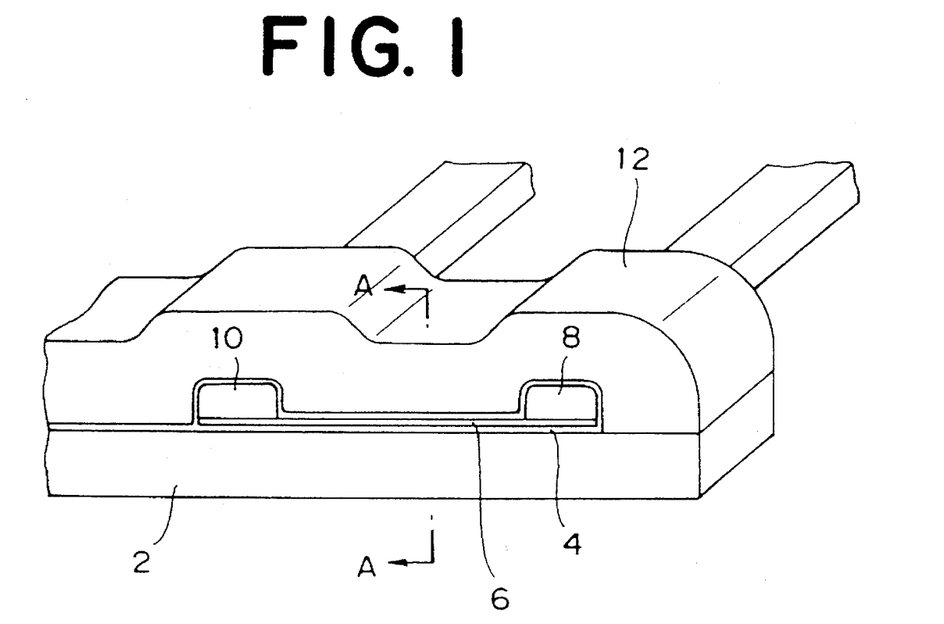
FIG. 1 is a perspective view of a Storage device in a first embodiment of the present invention.
Figure 2:
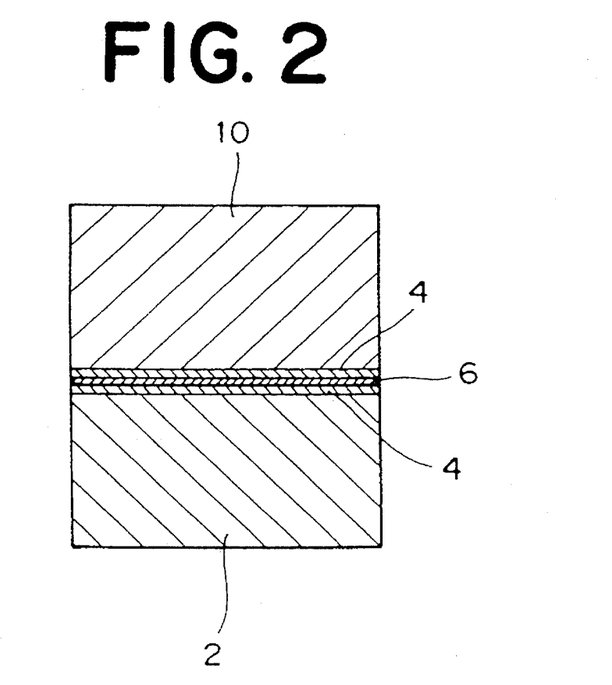
FIG. 2 is a sectional view taken along the line A—A in the device of FIG. 1.

FIG. 1 is a perspective view of a storage device in a first embodiment of the invention, and FIG. 2 is a sectional view taken along the line A—A in FIG. 1. Reference numeral 2 denotes a lower current line formed on an unshown substrate, and a magnetoresistive element (MR element) 6 is provided on the lower current line 2 via insulator layers 4. The MR element 6 may be a film formed by vapor deposition of NiFe for example. Terminals 8 and 10 are connected to both ends of the MR element 6, and an upper current line 12 is provided in such a manner as to surround the MR element 6 and the terminals 8 and 10.

Figure 3:
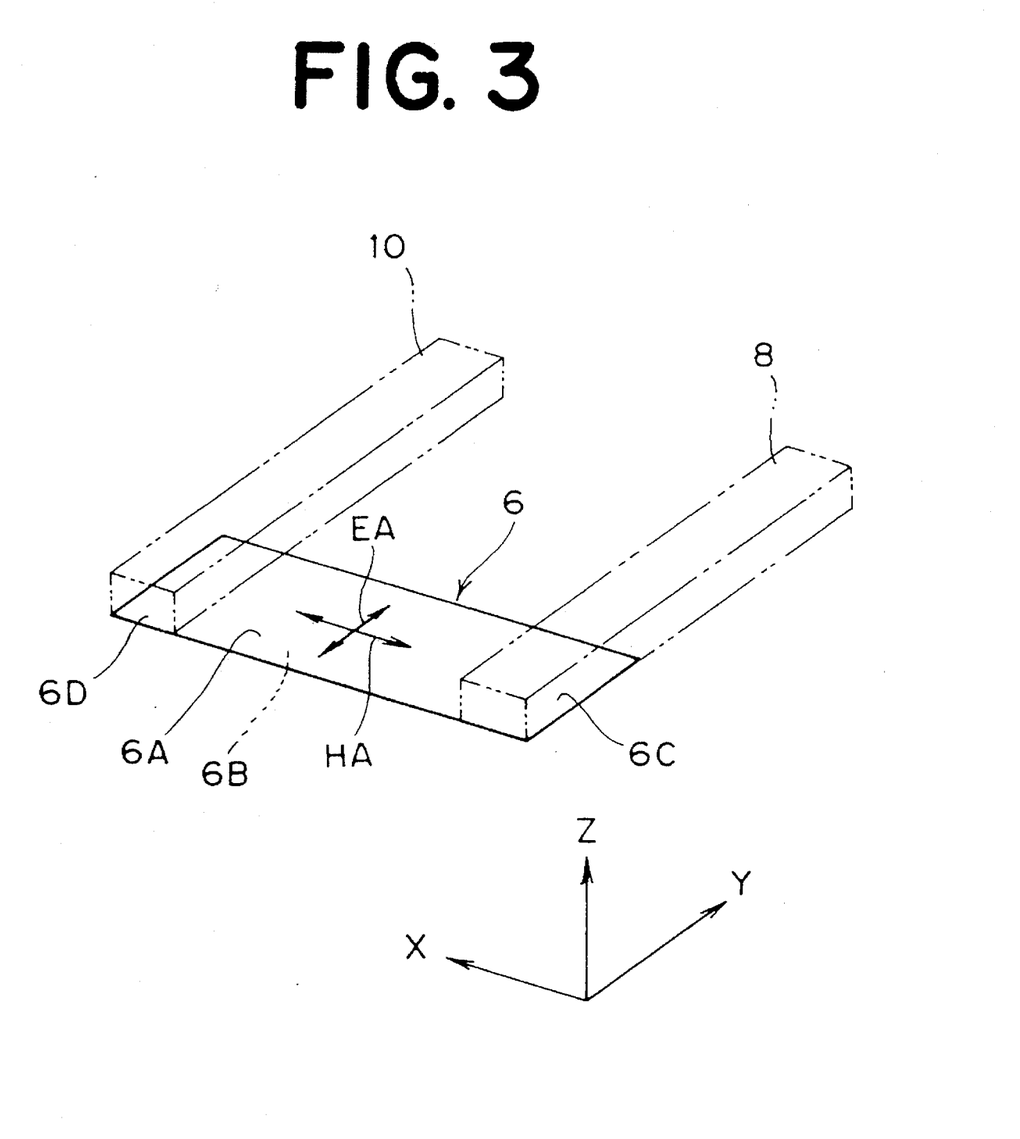
FIG. 3 is a perspective view of an MR element.

FIG. 3 is a perspective view of the MR element shown in FIG. 1. The MR element 6 is shaped into, e.g., a rectangular thin film having a hard axis HA of magnetization in its longitudinal direction and an easy axis EA of magnetization in its transverse direction. Further the MR element 6 has a first plane 6A and a second plane 6B corresponding respectively to its obverse side and reverse side, and a first end portion 6C and a second end portion 6D corresponding respectively to both ends of its longitudinal direction. On the first plane 6A, the terminals 8 and 10 are connected respectively to the first end portion 6C and the second end portion 6D of the MR element. The upper current line 12 and the lower current line 2 are opposed respectively to the first plane 6A and the second plane 6B of the MR element 6. For the purpose of serving convenience in the following description, there are defined here an X axis parallel with the hard axis HA of magnetization, a Y axis parallel with the easy axis EA of magnetization, and a Z axis perpendicular to the X axis and Y axis. In the X axis, the direction advancing from the first end portion 6C toward the second end portion 6D is defined as a +X direction, and the direction reverse thereto is defined as a −X direction. Meanwhile in the Y axis, the direction to lead out the terminals 8 and 10 is defined as a +Y direction, and the direction reverse thereto is defined as a −Y direction. And in the Z axis, the direction advancing from the second plane 6B toward the first plane 6A is defined as a +Z direction, and the direction reverse thereto is defined as a −Z direction.

In the first embodiment, write means includes a lower current lines 2 and an upper current line 12, means for causing a write current flow in the current lines 2 and 12 in mutually reverse directions, and means for deciding the direction of the write current flow correspondingly to the first or second state of the storage data. The first and second states correspond respectively to, e.g., 1 and 0 of digital data. In the following description, it is assumed that the first state corresponds to 1 and the second state to 0, respectively.

For causing a write current flow in the lower current line 2 and the upper current line 12 in mutually reverse directions, this embodiment is so contrived that one end portion of the upper current line 12 in the −X direction is connected to one end portion of the lower current line 2 in the same direction, whereby a single-turn coil is formed around the MR element 6. More specifically, the current lines 2 and 12 are connected in series to each other. It is to be understood that a coil of plural turns may be formed as well. The means for deciding the direction of the write current flow correspondingly to 1 or 0 comprises a constant current circuit having, e.g., two output ports, and a circuit for selectively switching the connection of each output port and the end portions of the current lines 2 and 12 in the +X direction correspondingly to 1 or 0. A specific example of the write/read circuit will be described later.

Figure 4A:
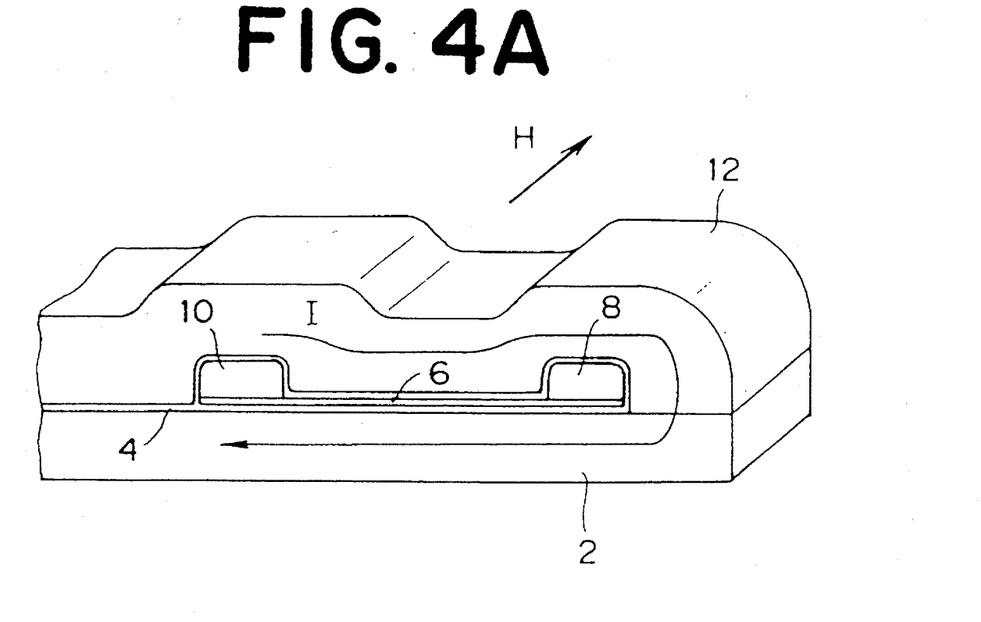
FIG. 4A and FIG. 4B are explanatory diagrams illustrating the directions of magnetization.
Figure 4B:
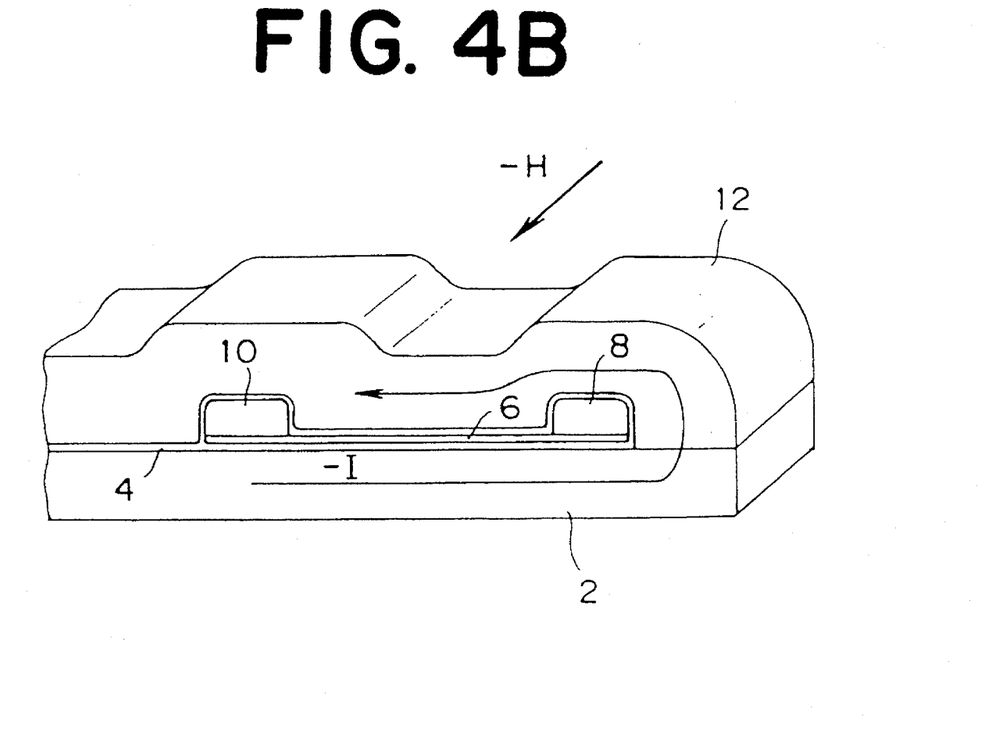

FIG. 4A and FIG. 4B show the directions of a magnetic field applied to the MR element 6 through the lower current line 2 and the upper current line 12. FIG. 4A represents one case where a current I is flowing from the upper current line 12 into the lower current line 2. In this case, the current flow in the upper current line 12 is in the −X direction, while the current flow in the lower current line 2 is in the +X direction. As a result, the magnetic field H is applied to the MR element 6 in the +Y direction substantially in parallel with the easy axis of magnetization. The intensity of a magnetic field H is given by the function of the current I. FIG. 4B represents another case where a current −I is flowing from the lower current line 2 into the upper current line 12. In this case, the current flow in the lower current line 2 is in the −X direction, while the current flow in the upper current line 12 is in the +X direction. As a result, a magnetic field −H is applied to the MR element 6 in the −Y direction substantially in parallel with the easy axis of magnetization. Thus, according to this embodiment where coiled current lines are provided around the MR element 6, a write magnetic field or a bias magnetic field of a desired strength can be applied in a desired direction.

Figure 5:
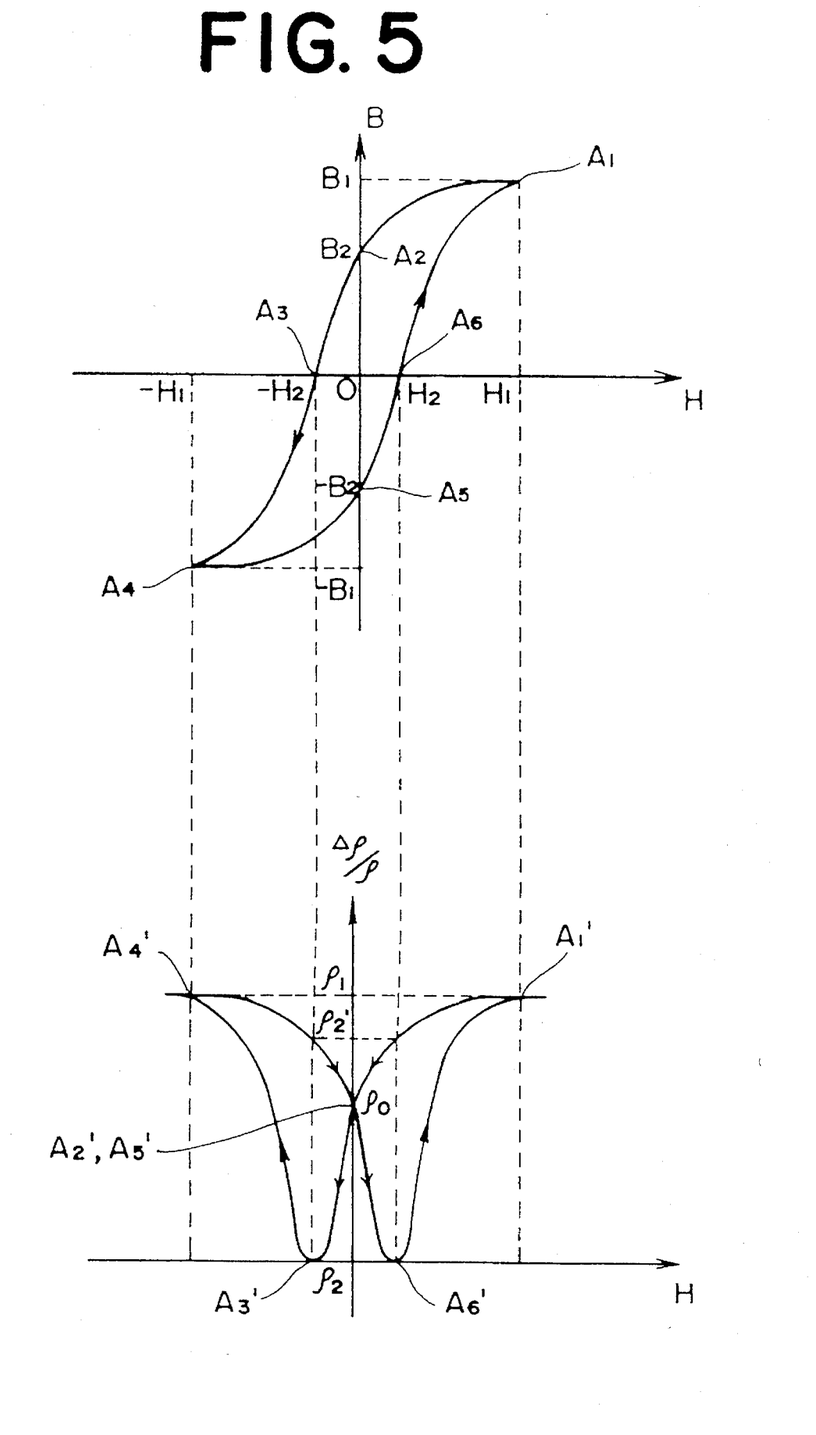
FIG. 5 graphically shows the principle of operation of a storage device.

FIG. 5 shows the principle of operation of the storage device. In this diagram, the B-H characteristic graphed in the upper part represents the relationship between the magnetic flux density B in the easy axis of magnetization of the MR element and the magnetic field H applied thereto; and the $\Delta p/p$-H characteristic graphed in the lower part represents the relationship between the volume resistivity change rate (MR ratio) $\Delta p/p$ of the MR element and the magnetic field H applied thereto. The applied magnetic field H in the B-H characteristic and the applied magnetic field H in the $\Delta p/p$-H characteristic are shown on the same scale. In this specification, the terms magnetization and magnetic flux density are used in the same sense. The MR element presents hysteresis characteristic in the relationship between the magnetic field H and the magnetization B, hence presenting hysteresis characteristic also in the relationship between the magnetic field H and the MR ratio $\Delta p/p$.

First, for storage of 1, a write current is caused to flow in the direction shown in FIG. 4A, and a magnetic field $H_1$, which is approximately equal in intensity to the magnetic field required for saturating the magnetization of the MR element, is applied to the MR element. The magnetization at this moment is $B_1$ as indicated at a point $A_1$, and the MR ratio is $p_1$ as indicated at a point $A_1'$. When the write current is switched off, the magnetization is reduced to $B_2$ ($B_2 < B_1$) as indicated at a point $A_2$, and the MR ratio is lowered to $p_0$ ($p_0 < p_1$) as indicated at a point $A_2'$, so that 1 is retained by the residual magnetization $B_2$.

Meanwhile for storage of 0, a write current is caused to flow in the direction shown in FIG. 4B, and a magnetic field $-H_1$, which is equal in intensity to the magnetic field $H_1$ but is directionally reverse thereto, is applied to the MR element. The magnetization at this moment is $-B_1$ as indicated at a point $A_4$, and the MR ratio is $p_1$ as indicated at a point $A_4'$. In the process of a transition from the point $A_2$ to the point $A_4$, the magnetization passes a point $A_3$ where the flux density is zero. The magnetic field at this moment is $-H_2$ ($-H_1 < -H_2 < 0$), and the MR ratio is $p_2$ ($p_2 < p_0$) as indicated at a point $A_3'$. When the write current corresponding to 0 is switched off, the magnetization is changed from $-B_1$ to $-B_2$ ($-B_1 < -B_2 < 0$), so that 0 is retained by such magnetization. The MR ratio at this moment is $p_0$ as indicated at a point $A_5'$.

For storage of 1 by overwriting it in the state where 0 is stored as indicated at a point $A_5$, the write magnetic field $H_1$ is applied again to the MR element to thereby transit the magnetization to the point $A_1$. In this process, the magnetization passes a point $A_6$ where the flux density is zero and the magnetic field is $H_2$ ($0 < H_2 < H_1$). The MR ratio corresponding to the point $A_6$ is $p_2$ as indicated at a point $A_6'$. When overwriting 1 at the point $A_2$ where 1 is presently stored, the write magnetic field $H_1$ is applied for transition of the magnetization from the point $A_2$ to the point $A_1$. Similarly, when overwriting 0 at the point $A_5$ where 0 is presently stored, the write magnetic field $-H_1$ is applied for transition of the magnetization from the point $A_5$ to the point $A_4$.

How to read out the stored data will now be described below. The directions (signs) of the retained magnetization in the 1 storage state ($A_2$) and the 0 storage state ($A_5$) are mutually different, but the MR ratio of the MR element is $p_0$ and the same in each case, so that it is impossible under such condition to read out the data stored in accordance with the difference of the MR ratio. Therefore, a bias magnetic field lower in intensity than the write magnetic field is applied to the MR element, and a discrimination between 1 and 0 is made depending on the numerical value of the MR ratio of the MR element at that time. The specific details are as follows.

In the example of FIG. 5, the bias magnetic field is set to $H_2$ or $-H_2$ which gives the minimum value $p_2$ of the MR ratio. In one case where the bias magnetic field is set to $H_2$, a bias current smaller than the write current is caused to flow in the direction shown in FIG. 4A. Meanwhile in the other case where the bias magnetic field is set to $-H_2$, the bias current is caused to flow in the direction shown in FIG. 4B. Suppose now that the bias current is set to $H_2$ for reading the stored data. When the stored data is 1, the MR ratio is increased from $p_0$ to $p_2'$ ($p_0 < p_2' < p_1$) by the application of the bias magnetic field. And when the stored data is 0, the MR ratio is lowered from $p_0$ to $p_2$ by the application of the bias magnetic field. The stored data is read out in this manner. In the other case where the bias magnetic field is set to $-H_2$, the MR ratio is changed inversely to the above example. That is, when 1 is stored, the MR ratio is lowered from $p_0$ to $p_2$ by the application of the bias magnetic field; and when 0 is stored, the MR ratio is increased from $p_0$ to $p_2'$ by the application of the bias magnetic field. The numerical value of the MR ratio can be discriminated by detecting the resistance value of the MR element 6 between the terminals 8 and 10 (see FIG. 1). This discrimination can be achieved by causing a flow of a resistance detection current between the terminals 8 and 10 and then detecting the voltage drop induced in the MR element 6.

This storage device is nonvolatile since data is stored therein by the direction (sign) of magnetization of the MR element, and it is usable at normal temperature. Moreover, the factor that limits the write and read speeds is merely the response of the magnetization to the applied magnetic field, so that the time required for writing, reading and overwriting the data can be minimized. In addition, it is possible to provide a high-reliability storage device of a simplified structure with simplified electric circuits as shown in FIG. 1. For the purpose of enhancing the read sensitivity, it is desired that the intensity of the write magnetic field is set to be approximately equal to or higher than the intensity of the magnetic field required for saturating the magnetization of the MR element. Also for the same purpose, it is desired that the bias magnetic field is so set as to maximize the difference between the MR ratio corresponding to 1 and that corresponding to 0 obtained when the bias magnetic field is applied to the MR element. Such bias magnetic field is in the extreme proximity of the point $A_3'$ or $A_6'$ in FIG. 5.

In the description given above, digital data 1 and 0 correspond respectively to the points $A_1$ and $A_4$ in FIG. 5. However, such correspondence may be reverse as well. In either case, if the direction of the residual magnetization based on the stored data and the direction of the bias magnetic field are mutually the same, the MR ratio is lowered by the application of the bias magnetic field. And if the direction of the residual magnetization based on the stored data and the direction of the bias magnetic field are mutually reverse, the MR ratio is increased by the application of the bias magnetic field.

Figure 6:
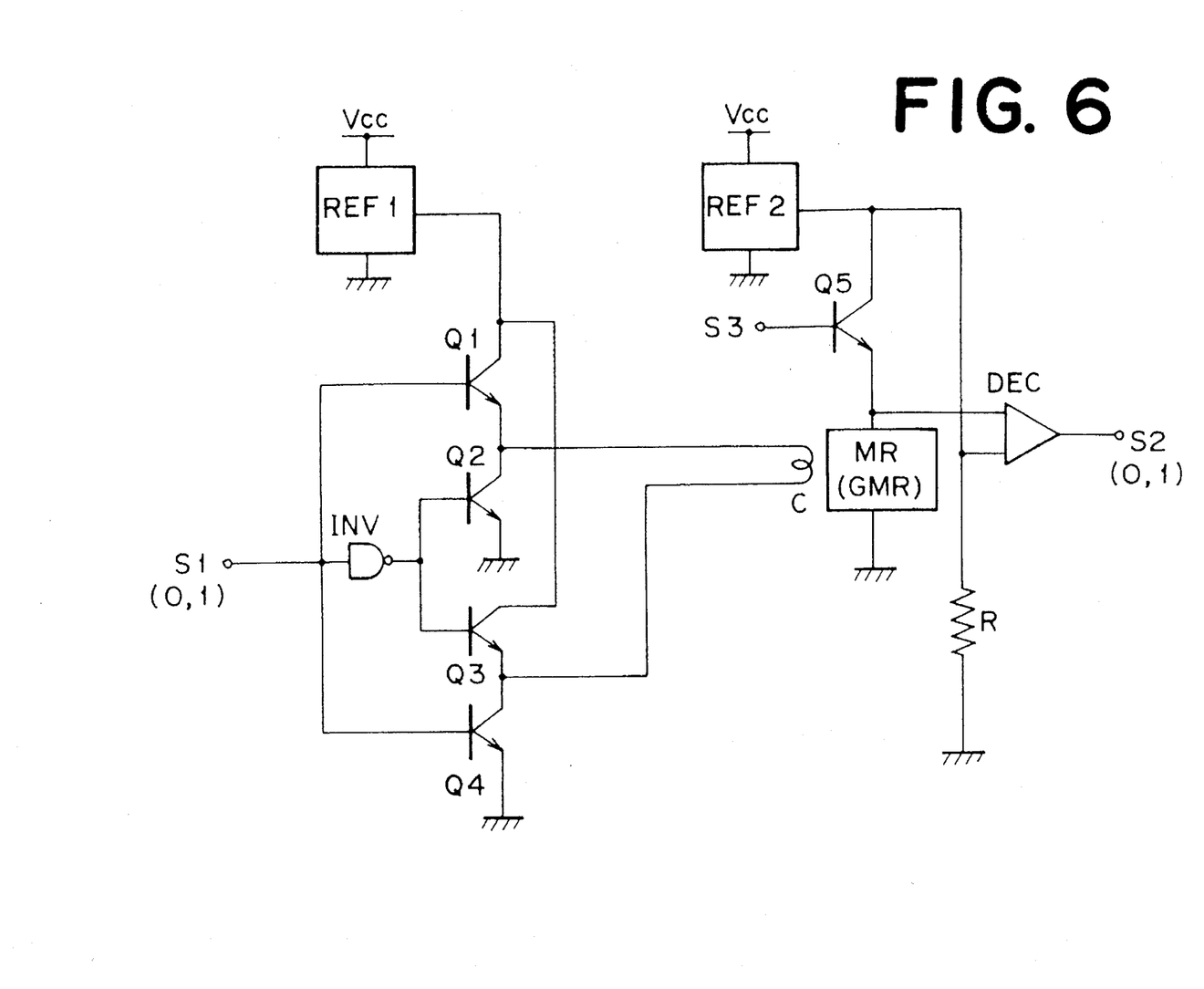
FIG. 6 is a block diagram of a write/read circuit.

Hereinafter a specific example of a write/read circuit will be described with reference to FIG. 6. In this diagram, REF1 and REF2 stand for constant current sources; Q1, Q2, Q3, Q4 and Q5 for transistors; INV for an inverter; MR (GMR) for the aforementioned MR element 6 or an undermentioned giant magnetoresistive element; C for a coil formed by the current lines 2 and 12; DEC for a decider; R for a reference resistor; S1 for a write input signal; S2 for a read output signal; and S3 for a read enable signal, respectively.

A write circuit is connected to the coil C, and a read circuit is connected to the MR element. The output of the constant current source REF1 is supplied to respective collectors of the transistors Q1 and Q3. An emitter of the transistor Q1 and a collector of the transistor Q2 are connected to one end of the coil C (upper current line 12), while an emitter of the transistor Q3 and a collector of the transistor Q4 are connected to the other end of the coil C (lower current line 2). Emitters of the transistors Q2 and Q4 are grounded respectively. The write input signal S1 is supplied directly to bases of the transistors Q1 and Q4 while being supplied, after inversion via the inverter INV, to bases of the transistors Q2 and Q3.

The output of the constant current source REF2 is supplied to a collector of the transistor Q5, a first input port of the decider DEC and a first end of the reference resistor R. The read enable signal S3 is supplied to a base of the transistor Q5, and an emitter of the transistor Q5 is connected to both a first terminal of the MR element and a second input port of the decider DEC. A second terminal of the MR element and a second end of the reference resistor R are grounded. The read output signal S2 is delivered from an output port of the decider DEC. The decider DEC makes a decision as to whether the potential at the first terminal of the MR element is greater or not than the voltage drop across the reference resistor R.

When the write input signal S1 is 1 at a high level, the transistors Q1 and Q4 are turned on while the transistors Q2 and Q3 are turned off, so that the current from the constant current source REF1 flows in the coil C downward in the diagram. Contrary to the above, when the write input signal S1 is 0 at a low level, the transistors Q2 and Q3 are turned on while the transistors Q1 and Q4 are turned off, so that the current from the constant current source REF1 flows in the coil C upward. Therefore, the direction of the current flowing in the coil C can be selectively switched in conformity to the write input signal 1 or 0 by the use of such write circuit.

Upon supply of the read enable signal S3 to the transistor Q5 in the read circuit, the current from the constant current source REF2 flows in the MR element to serve as a bias current. Consequently, it is possible to read out the stored data from the MR element by comparing the voltage drop in the MR element with the voltage drop in the reference resistor R, hence obtaining an output signal S2.

Figure 7:
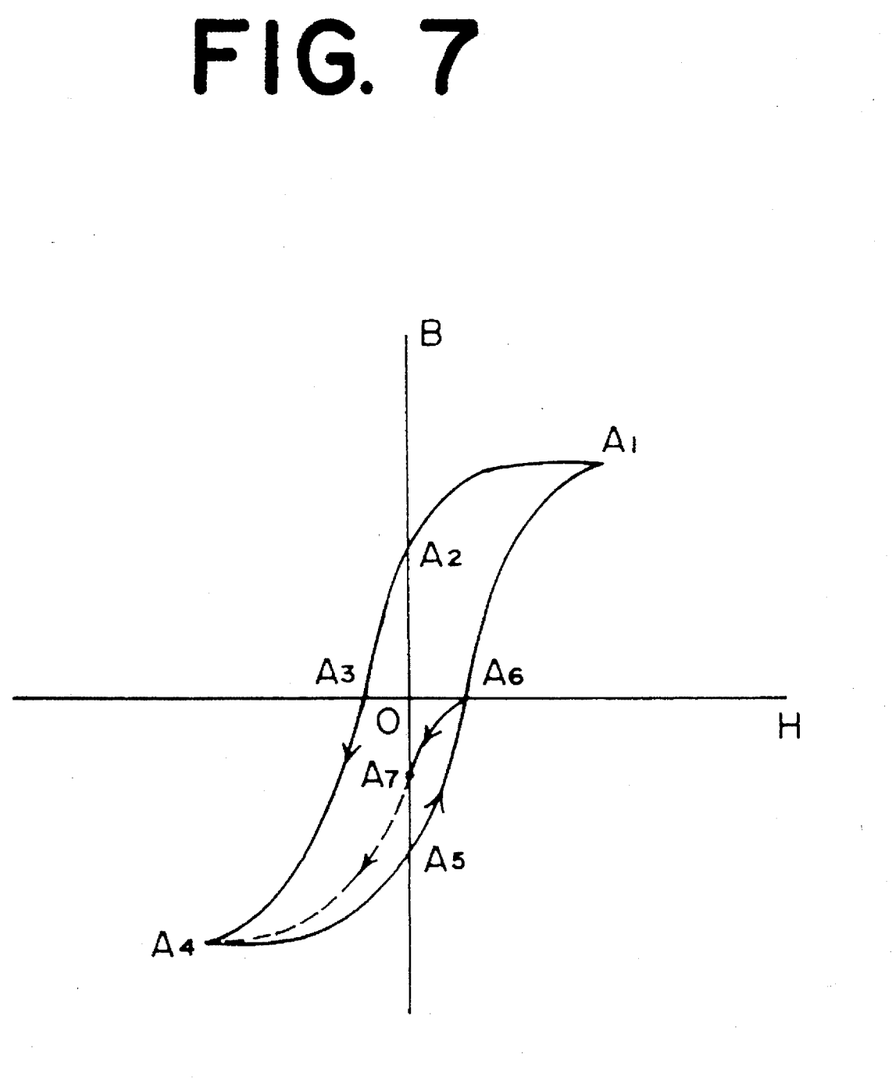
FIG. 7 graphically illustrates demagnetization of an MR element.

FIG. 7 graphically illustrates demagnetization of the MR element induced by the application of a bias magnetic field, and it corresponds to the graph of FIG. 5 showing the B-H characteristic. Assume now that a bias magnetic field is applied to the MR element at a point $A_5$ where data is stored, and subsequently the bias magnetic field is switched off after transition to a point $A_6$. Then the residual magnetization (residual magnetic flux) of the MR element is shifted toward the origin in the B-H characteristic as indicated at a point $A_7$. This phenomenon is termed demagnetization. Contrary to the above, no demagnetization is induced if the bias magnetic field is switched off after being applied in the same direction at a data-stored point $A_2$. Generally speaking, demagnetization is induced when the direction of the bias magnetic field is reverse to that of the magnetization based on the stored data. Upon occurrence of such demagnetization, it becomes difficult to read out the same stored data a plurality of times. In such a case, the write magnetic field for writing the same data may be reapplied on the basis of the data read out by applying the bias magnetic field. Then it is rendered possible by this process to read out the same stored data a plurality of times.

Figure 8:
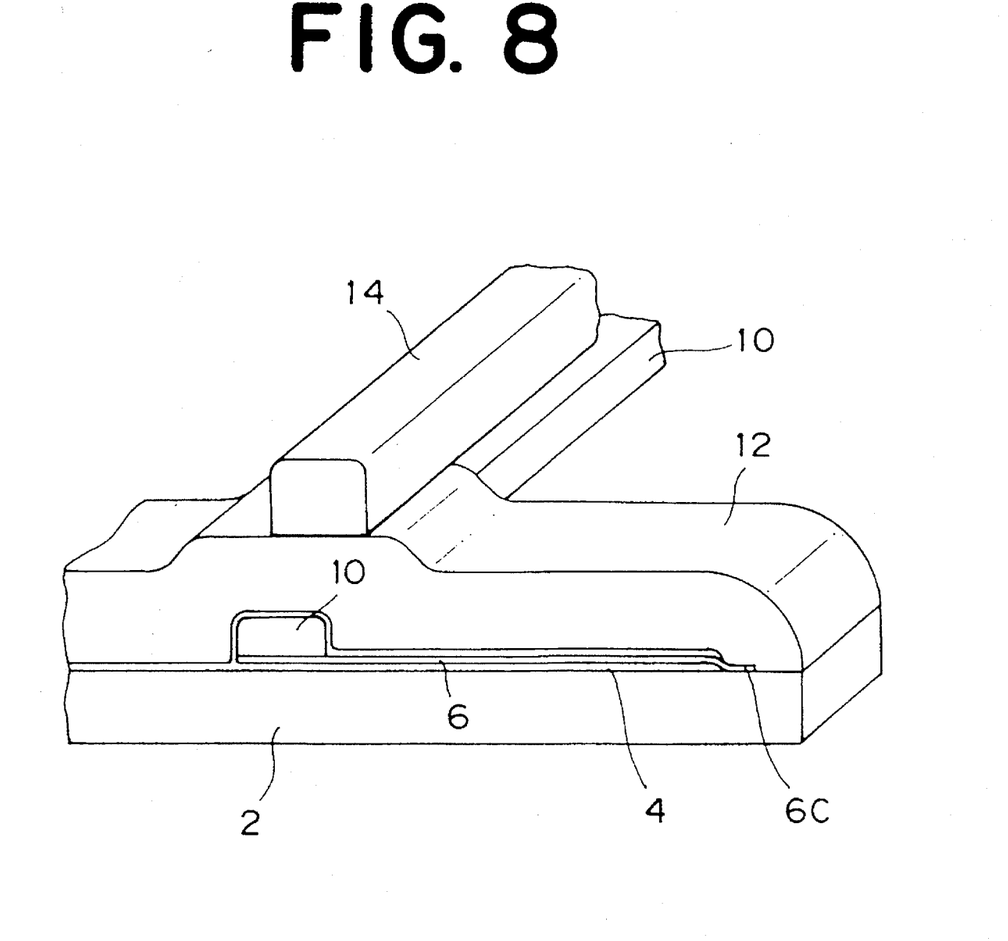
FIG. 8 is a perspective view of a storage device in a second embodiment of the present invention.

FIG. 8 is a perspective view of a storage device in a second embodiment of the present invention. In comparison with the foregoing first embodiment, the second embodiment is characterized in that the terminal 8 is omitted, and another terminal 14 is additionally provided. The terminal 14 is connected to the upper current line 12 at a position corresponding to the terminal 10. The MR element 6 is connected to the two current lines 2 and 12 in such a manner that the second end portion 6C thereof is sandwiched between the respective joints of the lower current line 2 and the upper current line 12. According to this embodiment, a resistance detection current for detecting the MR ratio of the MR element 6 can be caused to flow in the upper current line 12. More specifically, a current source for such resistance detection is connected between the terminals 10 and 14.

When the resistance detection current flows in the upper current line 12, a bias magnetic field can be applied to the MR element 6 by this current flow substantially in parallel with the easy axis of magnetization. Thus, it is possible in the second embodiment to use the resistance detection current also as a bias current, hence reducing the power consumption in reading the data. The terminal 14 can be omitted as well. In this case, the resistance detection current is caused to flow between the terminal 10 and one end of the upper current line 12 in the +X direction. Then the read terminal can serve also as a write current line to thereby enhance the packaging density in mounting a plurality of storage cells of this structure on a substrate. In case the terminal 14 is omitted, the resistance detection current may also be caused to flow between the terminal 10 and one end of the lower current line 2 in the +X direction.

Figure 9:
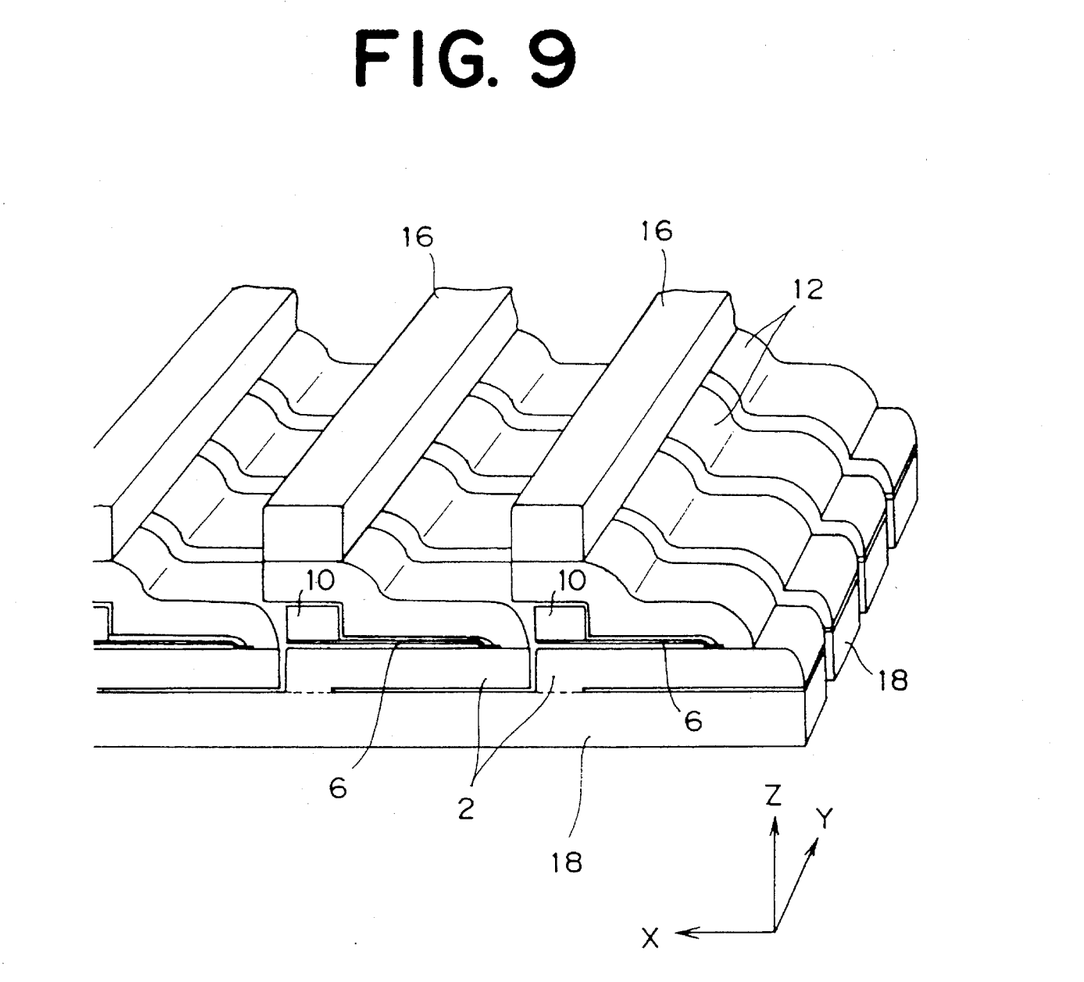
FIG. 9 is a perspective view of a storage device in a third embodiment of the present invention.

FIG. 9 is a perspective view of a storage device in a third embodiment of the present invention, wherein a multiplicity of cells each having the structure of FIG. 8 are arrayed in a manner to form a matrix. For arraying the MR elements in the form of a matrix, a plurality of bit lines 16 and a plurality of word lines 18 are arranged. The bit lines 16 are connected to a plurality of upper current lines 12 arranged in the Y-axis direction, while the word lines 18 are connected to a plurality of lower current lines 2 arranged in the X-axis direction. The terminal 10 shown in FIG. 8 is used in common for all the cells arrayed in the Y-axis direction. In this embodiment, the bit lines 16 correspond to the terminal 14 in FIG. 8. In a write mode, one storage cell can be selected by a combination of one bit line 16 and one word line 18. Also in a read mode, one storage cell can be selected by a combination of the terminal 10 and one word line 18.

Figure 10A:
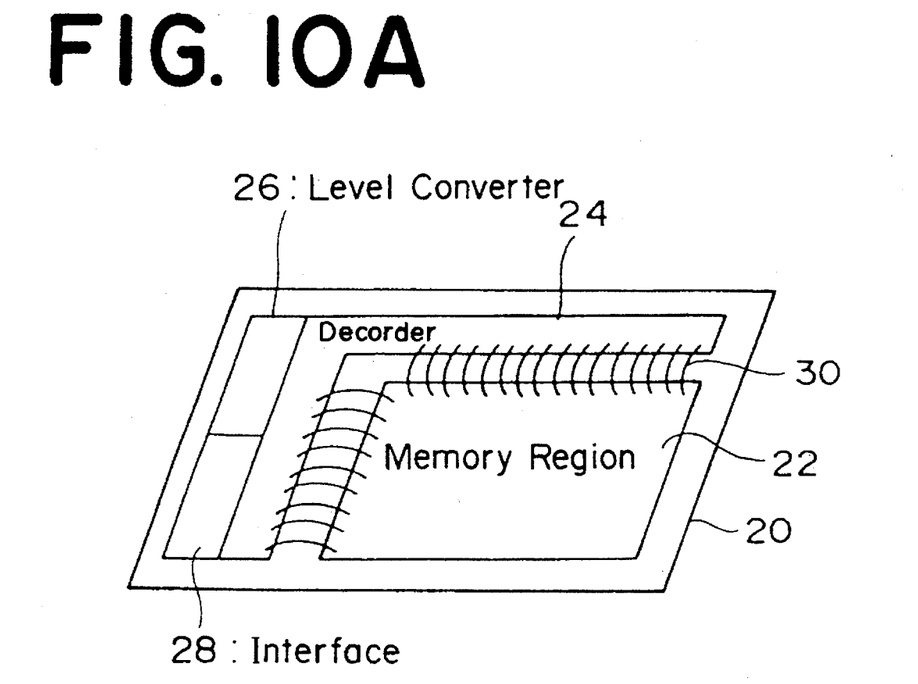
FIG. 10A and FIG. 10B illustrate packaged examples having the structure of FIG. 9.
Figure 10B:
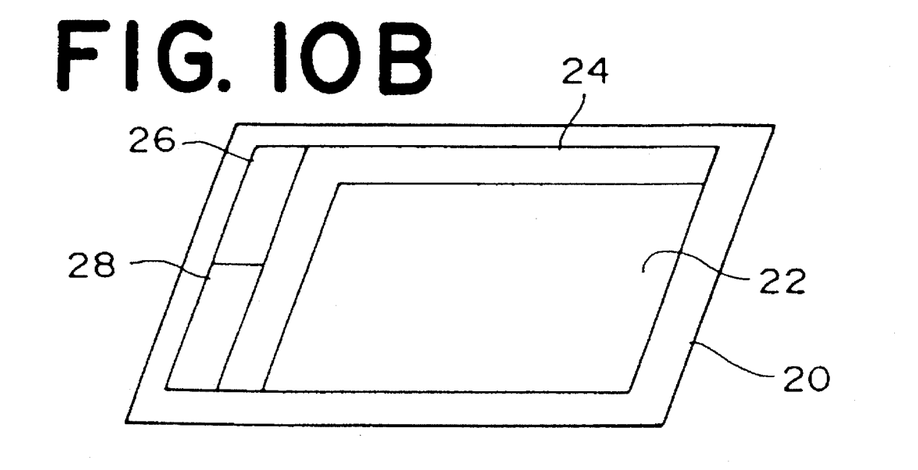

FIG. 10A and FIG. 10B illustrate packaged examples each having the structure of FIG. 9. In one example shown in FIG. 10A, a memory region 22 is formed on a substrate 20 by the structure of FIG. 8, and a decoder circuit 24, a level converter circuit 26 and an interface circuit 28 are formed in the vicinity of the memory region 22. The memory region 22 and the decoder circuit 24 are connected to each other by means of a bonding wire 30. In another example shown in FIG. 10B, the memory region 22 and the decoder circuit 24 are connected directly to each other by means of a thin-film conductor layer with omission of the bonding wire 30. The decoder circuit 24 serves to designate a desired address in the memory region 22, and the level converter circuit 26 serves to render the device of this invention interchangeable with the conventional known storage device. In addition to the component circuits described above, there may be further formed a write current control circuit and a read current control circuit on the substrate 20.

Next, an example of the recording density in the embodiment of FIG. 9 will be calculated below as a trial. Assume now that each line has a thickness of 3 μm and a width of 2 μm, the MR element has an effective length of 2 μm, and the write current is 30 mA. Under such conditions, the intensity of the write magnetic field is approximately 190 Oe (1×30 mA/2 μm=15000 A/m=188.4 Oe). And the resistance change rate at the application of a bias magnetic field of 30 Oe or so is approximately 15 percent. In an exemplary case where each storage cell has an area of 3×4 μm$^2$, the recording density is 83.25 Kbits/mm$^2$ (53.71 Mbits/in$^2$).

Figure 11:
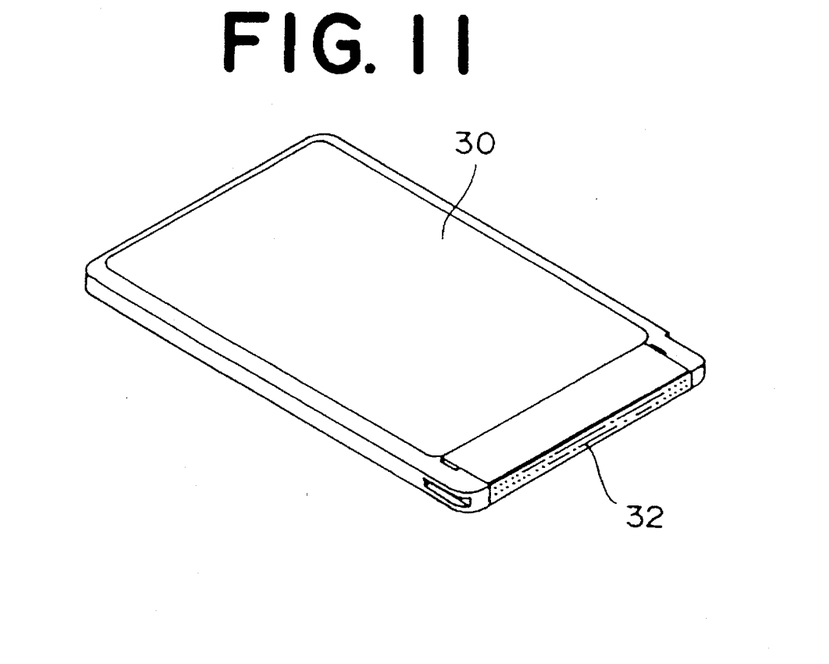
FIG. 11 is a perspective view of a memory card to which the present invention is applicable.

FIG. 11 is an exterior perspective view of a memory card to which the present invention is applicable. This memory card comprises a main body 30 where, e.g., the substrate 20 shown in FIG. 10A is incorporated, and a connector 32 for connection to an external circuit. For example, it is supposed to be an IC memory card size Type-1 prescribed by PCMCIA. Since this memory card has an area of 4505 mm$^2$ (85 mm×53 mm), the area of its effective storage region, which is 80 percent of the entire area in this example, is approximately 3600 mm$^2$. Therefore, in a four-layer structure, the storage capacity amounts to 150 Mbytes at a recording density of 83.25 Kbits/mm$^2$. It is to be understood that the present invention is not limited to such a memory card alone and may also be applied to any plastic (resin) package similar to the conventional dynamic random access memory or static random access memory known heretofore (refer to FIGS. 15A and 15B).

The MR element may be an ordinary anisotropic magnetoresistive element (AMR element), and a giant magnetoresistive element (GMR element) may be employed as well. A GMR element is characterized in that, since the directions of magnetizations are mutually unparallel on both sides of an insulator film, the attainable magnetoresistive effect is greater by one digit than that of an AMR element.

Figure 12:
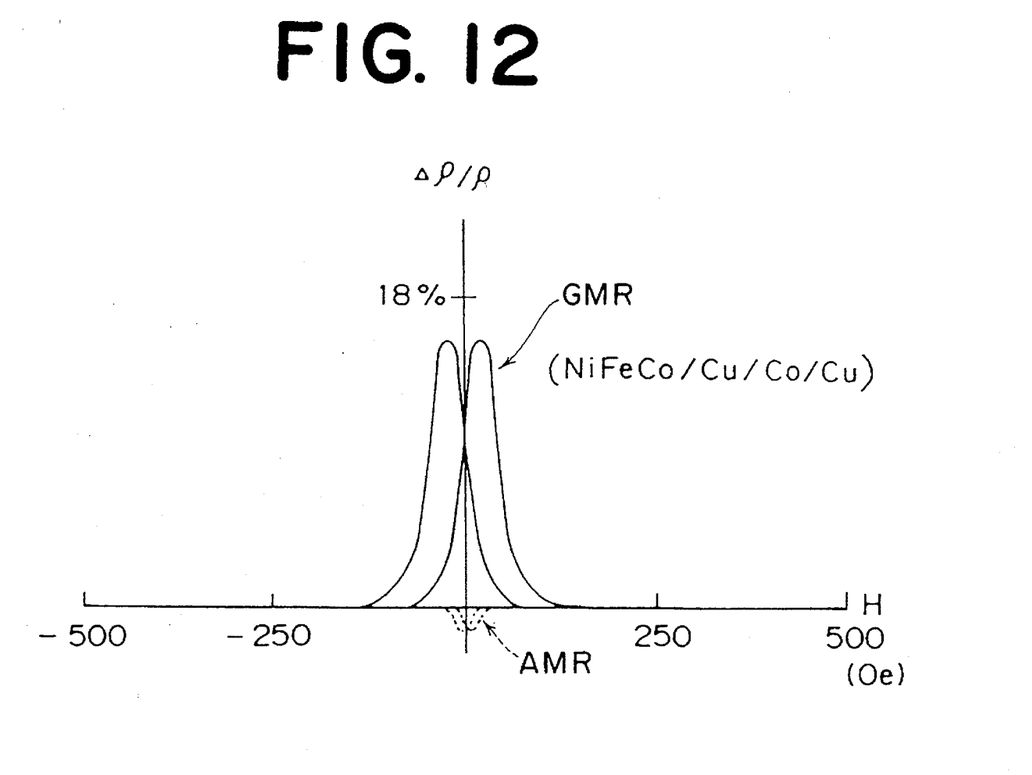
FIG. 12 graphically shows the characteristic of a GMR element.

FIG. 12 graphically shows the characteristic of a GMR element which is composed of layers of, e.g., NiFeCo, Cu, Co and Cu deposited successively in this order, wherein a symbol GMR denotes its characteristic curve. The MR ratio (Δp/p) is taken along the ordinate, and the applied magnetic field is taken along the abscissa. For comparison, the characteristic curve of an AMR element is denoted by a symbol AMR. Thus, the GMR element has superior hysteresis characteristic in addition to its great magnetoresistive effect, hence capable of realizing a high S/N. Differing from the anisotropic magnetoresistive element described above, the GMR element has no distinction between an easy axis of magnetization and a hard axis of magnetization. Consequently, to the GMR element shaped into a thin film, both a write magnetic field and a bias magnetic field are applied substantially in parallel with the in-plane direction of the thin film.

Figure 13:
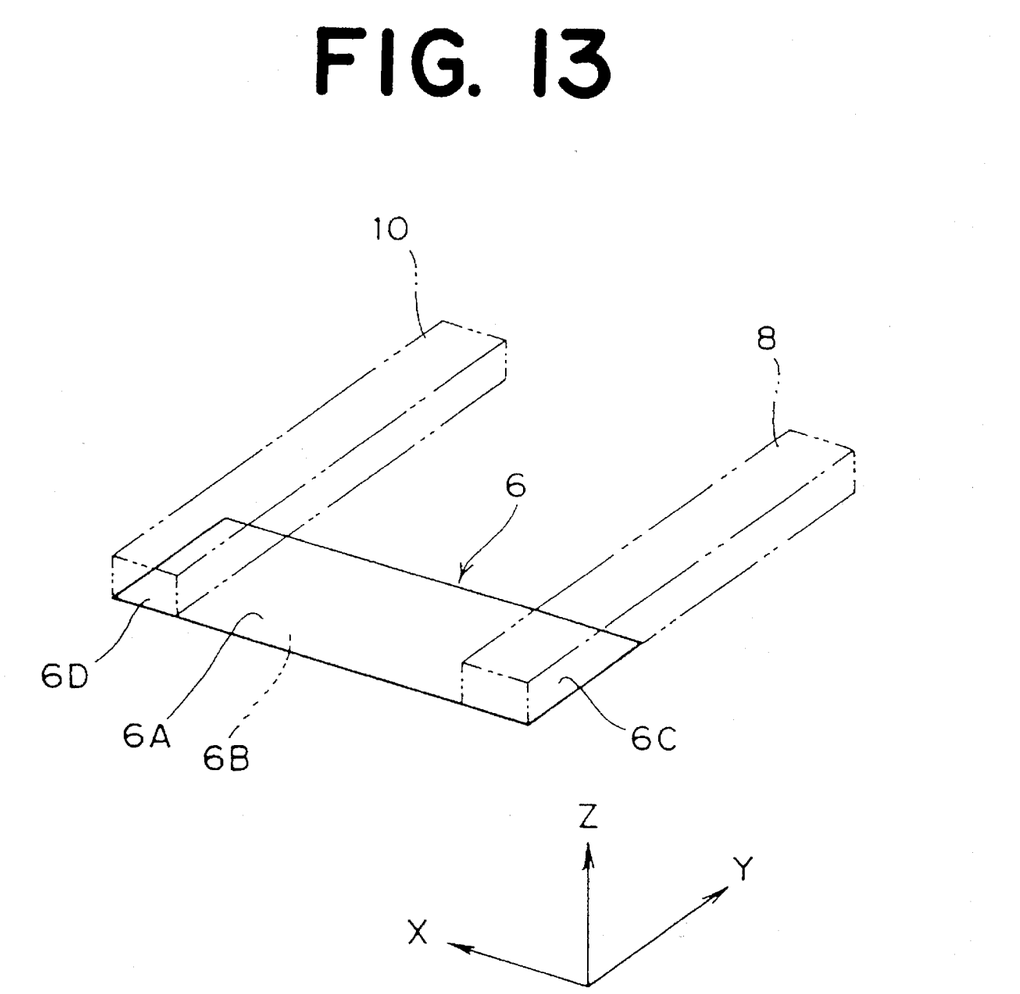
FIG. 13 is a perspective view of the GMR element.
Figure 14:
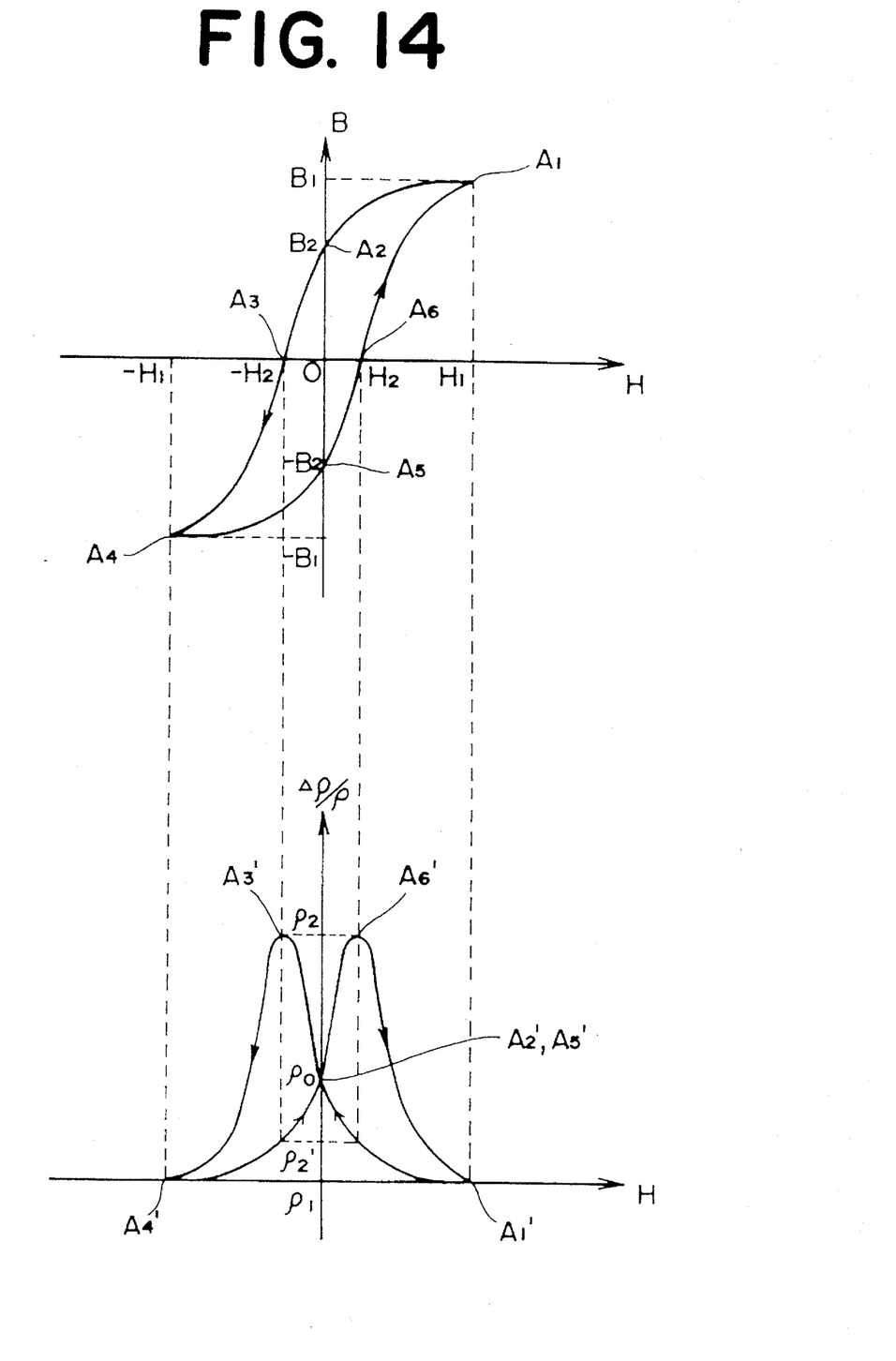
FIG. 14 graphically illustrates the principle of operation of the GMR element.

Hereinafter a description will be given on the principle of operation of a GMR element 6 produced as illustrated in FIG. 13 similarly to the aforementioned one in FIG. 3. As graphically shown in FIG. 14, the B-H characteristic of the GMR element 6 is substantially equal to that of the AMR element in FIG. 5. However, the Δp/p-H characteristic of the GMR element 6 is one obtained by inverting the characteristic of FIG. 5 with respect to the axis of the MR ratio. Consequently, the relationship among the numerical values of the MR ratio is rendered reverse. That is, $p_1 < p_2' < p_0 < p_2$. Desired hysteresis characteristic is obtainable also in using the GMR element as shown in FIG. 14, so that it becomes possible to write and read the data in accordance with the principle of operation similar to the aforementioned one in FIG. 5.

Figure 15A:
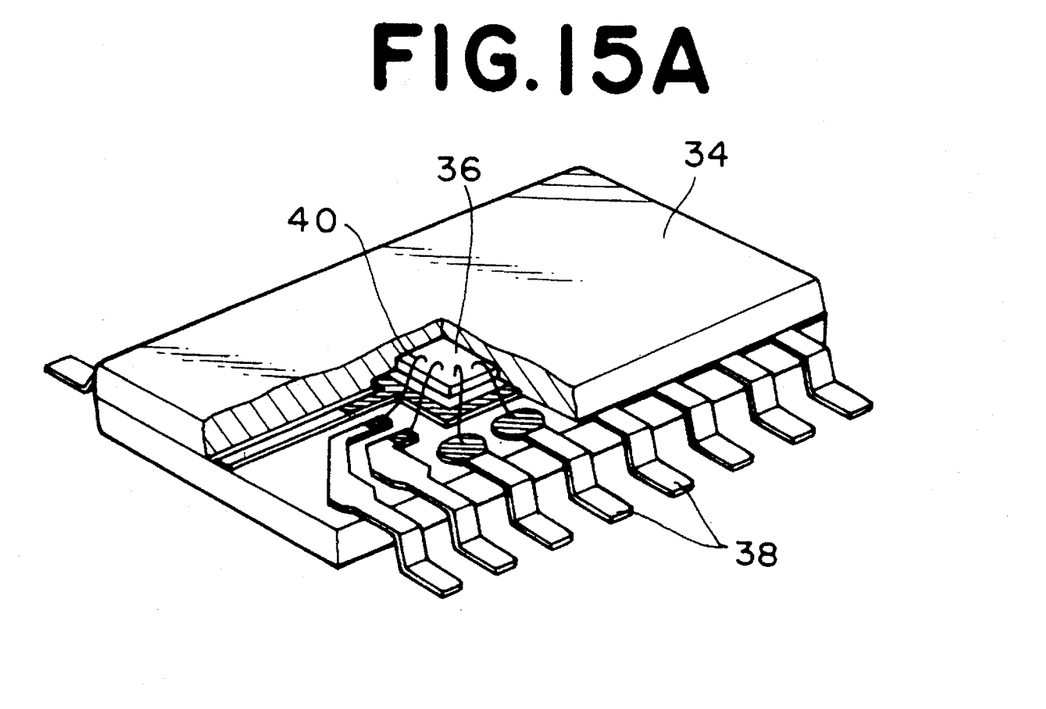
FIG. 15A and FIG. 15B are perspective views of SOP and SOJ, respectively, with partly broken away to show some components.

FIG. 15A is a perspective view of a SOP (Small Outline Package) with partly broken away to show some components. The present invention is applicable to the SOP. The SOP comprises a resin body 34 where a memory chip (e.g., the substrate 20 shown in FIG. 10A) 36 is incorporated and leads 38 for connection to an external circuit. The memory chip 36 is connected to the leads 38 with bonding wires 40.

Figure 15B:
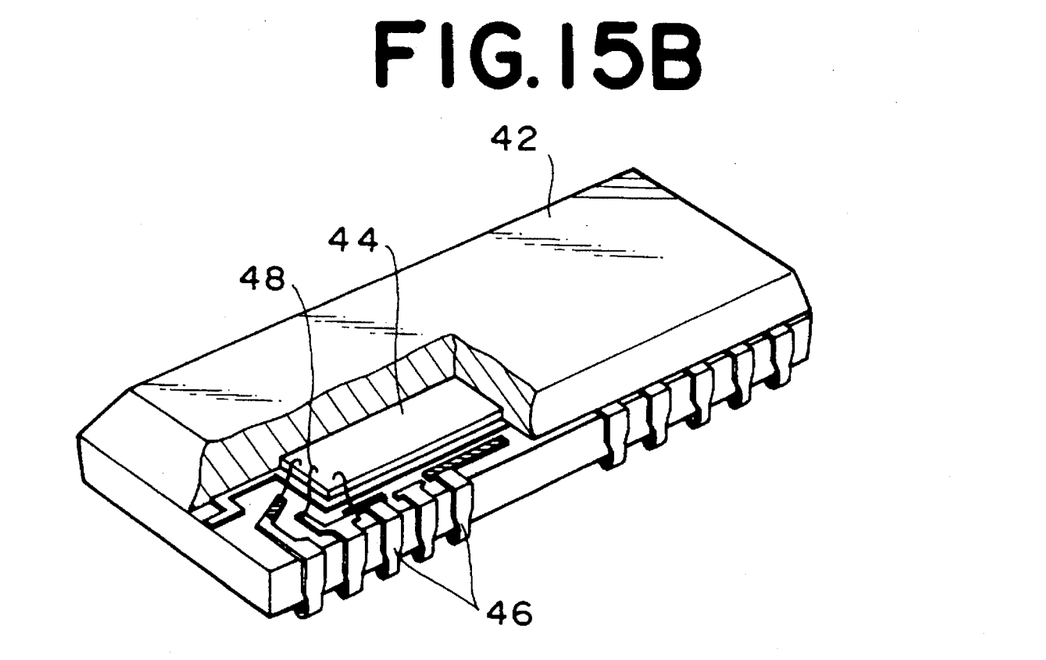

FIG. 15B is a perspective view of a SOJ (Small Outline J-bend Package) with partly broken away to show some components. The present invention is applicable to the SOJ. The SOJ comprises a resin body 42 where a memory chip (e.g., the substrate 20 shown in FIG. 10A) 44 is incorporated and J-bended leads 46 for connection to an external circuit. The memory chip 44 is connected to the J-bended leads 46 with bonding wires.

As described hereinabove, the present invention ensures advantageous effects of realizing a high-reliability magnetoresistive storage device of a simplified structure which is nonvolatile and usable at normal temperature with another advantage of reducing a write, read or overwrite time.

While specific embodiments of the present invention have been described in the foregoing description, the present invention is not limited to details of the embodiments. The spirit and scope of the present invention is defined in the appended claims, and all alterations and modifications which belong to the scope of equivalency of the claims shall be included in the scope of the present invention.

What is claimed is:

1. A storage device comprising:

a magnetoresistive element presenting hysteresis characteristic in the relationship between a magnetic field and a volume resistivity change rate;

write means for applying, in response to input binary storage data indicative of change either a first state or a second state, a write magnetic field of a predetermined intensity in a first direction to said magnetoresistive element correspondingly to said first state, or applying said write magnetic field in a second direction, which is reverse to said first direction, to said magnetoresistive element correspondingly to said second state; and read means for applying to said magnetoresistive element a bias magnetic field which is lower in intensity than said write magnetic field, and discriminating between said first and second states on the basis of the volume resistivity change rate of said magnetoresistive element.

2. The storage device according to claim 1, wherein the predetermined intensity of said write magnetic field is approximately equal to the intensity of a magnetic field required for saturating the magnetization of said magnetoresistive element.

3. The storage device according to claim 1, wherein said bias magnetic field is set in such a manner as to maximize the difference between the volume resistivity change rate of said magnetoresistive element corresponding to said first state and the volume resistivity change rate of said element corresponding to said second state.

4. The storage device according to claim 1, wherein said bias magnetic field is applied in said first direction, and said read means discriminates said first or second state depending on whether the volume resistivity change rate of said magnetoresistive element is relatively small or great.

5. The storage device according to claim 1, wherein said bias magnetic field is applied in said second direction, and said read means discriminates said first or second state depending on whether the volume resistivity change rate of said magnetoresistive element is relatively great or small.

6. The storage device according to claim 1, wherein said magnetoresistive element is shaped into a thin film and has an easy axis of magnetization and a hard axis of magnetization mutually orthogonal on the in-plane direction of said thin film;

said magnetoresistive element has a first plane and a second plane corresponding respectively to the obverse side and the reverse side thereof, and also has a first end portion and a second end portion corresponding respectively to both ends thereof;

said write means includes an upper current line and a lower current line opposed to said first plane and second plane respectively, means for causing a write current flow in said upper and lower current lines in mutually reverse directions, and means for deciding the direction of said write current flow in accordance with said first or second state;

said write magnetic field is applied substantially in parallel with said easy axis of magnetization;

said read means includes first and second terminals connected to said first and second end portions respectively, means for detecting the resistance value between said first and second terminals, and means for causing a bias current flow, which is lower than said write current, in said upper and lower current lines in mutually reverse directions;

and said bias magnetic field is applied substantially in parallel with said easy axis of magnetization.

7. The storage device according to claim 6, wherein said upper current line is connected electrically to said lower current line in the vicinity of either of said first and second end portions, and said upper and lower current lines are in series to said write current and bias current.

8. The storage device according to claim 1, wherein said magnetoresistive element is shaped into a thin film and has an easy axis of magnetization and a hard axis of magnetization mutually orthogonal on the in-plane direction of said thin film;

said magnetoresistive element has a first plane and a second plane corresponding respectively to the obverse side and the reverse side thereof, and also has a first end portion and a second end portion corresponding respectively to both ends thereof;

said write means includes an upper current line and a lower current line opposed to said first plane and second plane respectively, means for causing a write current flow in said upper and lower current lines in mutually reverse directions, and means for deciding the direction of said write current flow in accordance with said first or second state;

said write magnetic field is applied substantially in parallel with said easy axis of magnetization;

said upper and lower current lines are connected to said first end portion;

said read means includes a terminal connected to said second end portion, and means for causing a resistance detection current to flow between said terminal and said upper current line;

and said bias magnetic field is applied substantially in parallel with said easy axis of magnetization by said resistance detection current.

9. The storage device according to claim 8, wherein a plurality of said magnetoresistive elements are employed, and bit lines and word lines are provided for arranging said elements in a matrix, said bit lines and word lines being connected to said upper current line and lower current line respectively.

10. The storage device according to claim 1, further comprising means for reapplying the write magnetic field to said magnetoresistive element so that the storage data read out by the application of said bias magnetic field is written again.

11. The storage device according to claim 1, wherein said magnetoresistive element comprises a giant magnetoresistive element shaped into a thin film;

said element has a first plane and a second plane corresponding respectively to the obverse side and the reverse side thereof, and also has a first end portion and a second end portion corresponding respectively to both ends thereof;

said write means includes an upper current line and a lower current line opposed to said first plane and second plane respectively, means for causing a write current flow in said upper and lower current lines in mutually reverse directions, and means for deciding the direction of said write current flow in accordance with said first or second state;

said write magnetic field is applied substantially in parallel with the thin film in-plane direction of said magnetoresistive element;

said read means includes a first terminal and a second terminal connected to said first end portion and second end portion respectively, means for detecting the resistance value between said first and second terminals, and means for causing a bias current flow, which is smaller than said write current, in said upper and lower current lines in mutually reverse directions;

and said bias magnetic field is applied substantially in parallel with said write magnetic field.

12. The storage device according to claim 11, wherein said upper current line is connected electrically to said lower current line in the vicinity of either of said first and second end portions, and said upper and lower current lines are in series to said write current and bias current.

13. The storage device according to claim 1, wherein said magnetoresistive element comprises a giant magnetoresistive element shaped into a thin film;

said element has a first plane and a second plane corresponding respectively to the obverse side and the reverse side thereof, and also has a first end portion and a second end portion corresponding respectively to both ends thereof;

said write means includes an upper current line and a lower current line opposed to said first plane and second plane respectively, means for causing a write current flow in said upper and lower current lines in mutually reverse directions, and means for deciding the direction of said write current flow in accordance with said first or second state;

said write magnetic field is applied substantially in parallel with the thin film in-plane direction of said magnetoresistive element;

said read means includes a terminal connected to said end portion, and means for causing a resistance detection current to flow between said terminal and said upper current line;

and said bias magnetic field is applied substantially in parallel with said write magnetic field by said resistance detection current.

14. The storage device according to claim 13, wherein a plurality of said magnetoresistive elements are employed, and bit lines and word lines are provided for arraying said elements in a matrix, said bit lines and word lines being connected to said upper current line and lower current line respectively.

15. The storage device according to claim 1, wherein the storage device is incorporated in a memory card body.

16. The storage device according to claim 1, wherein the storage device is incorporated in a small outline package.

* * * * *